(12) United States Patent
Schwan et al.

(10) Patent No.: US 7,659,170 B2
(45) Date of Patent: Feb. 9, 2010

(54) METHOD OF INCREASING TRANSISTOR DRIVE CURRENT BY RECESSING AN ISOLATION TRENCH

(75) Inventors: Christoph Schwan, Gebhardsbain (DE);
Manfred Horstmann, Duerrrhoehrsdorf-Ditterbach (DE);
Martin Gerhardt, Dresden (DE);
Markus Forseberg, Dresden (DE)

(73) Assignee: GlobalFoundries, Inc., Grand Cayman (KY)

( * ) Notice: Subject to any disclaimer, the term of this patent is extended or adjusted under 35 U.S.C. 154(b) by 394 days.

(21) Appl. No.: 11/620,406

(22) Filed: Jan. 5, 2007

(65) Prior Publication Data
US 2007/0278596 A1    Dec. 6, 2007

(30) Foreign Application Priority Data
May 31, 2006    (DE) .................... 10 2006 025 364

(51) Int. Cl.
*H01L 21/762*    (2006.01)

(52) U.S. Cl. ................. 438/296; 438/435; 257/E21.628
(58) Field of Classification Search .................. 438/421
See application file for complete search history.

(56) References Cited

U.S. PATENT DOCUMENTS

| | | | |
|---|---|---|---|
| 6,159,823 A | 12/2000 | Song et al. | 438/437 |
| 6,232,640 B1 | 5/2001 | Okada et al. | 257/374 |
| 6,245,637 B1 | 6/2001 | Tsai | 438/421 |
| 2005/0127468 A1 | 6/2005 | Ito | 257/501 |
| 2006/0001108 A1 | 1/2006 | Yamamoto | 257/395 |
| 2006/0121688 A1* | 6/2006 | Ko et al. | 438/439 |

* cited by examiner

*Primary Examiner*—Stephen W Smoot
(74) *Attorney, Agent, or Firm*—Williams, Morgan & Amerson, P.C.

(57) ABSTRACT

By recessing the isolation structure of a transistor prior to silicidation, the series resistance may be reduced due to the increased amount of metal silicide formed in the vicinity of the isolation structure. By recessing the isolation structure prior to the formation of the gate electrode, an increased degree of poly wrap around may be obtained, thereby increasing the effective channel width.

13 Claims, 7 Drawing Sheets

METHOD OF INCREASING TRANSISTOR DRIVE CURRENT BY RECESSING AN ISOLATION TRENCH

BACKGROUND OF THE INVENTION

1. Field of the Invention

Generally, the present disclosure relates to the field of fabrication of integrated circuits, and, more particularly, to semiconductor devices having metal-silicide portions on semiconductor regions to reduce the resistance of the semiconductor regions.

2. Description of the Related Art

In modern ultra-high density integrated circuits, device features are steadily decreased to enhance device performance and functionality. One important circuit element in complex integrated circuits is a field effect transistor, which represents a component having a channel region, whose conductivity may be controlled by an electric field that is generated by applying a control voltage to a gate electrode formed near the channel region and separated therefrom by a gate insulation layer. The channel region is generally defined by respective PN junctions formed by an interface of highly doped drain and source regions and an inversely doped region located between the drain and source regions. Important characteristics for the performance of an integrated circuit are, among others, the switching speed of the individual transistor elements and the drive current capability. Thus, one important aspect for obtaining a high transistor performance is the reduction of the overall resistance of the current path defined by the channel region, the resistance of the drain and source regions and the respective contacts that connect the transistor with peripheral devices, such as other transistors, capacitors and the like. The reduction of the channel length thus provides reduced resistance of the channel region and also offers the potential to increase the packing density of the integrated circuit. Upon reducing the transistor dimension, the transistor width is also typically reduced in view of packing density and switching speed, which may, however, reduce the drive current capability. It is, therefore, of great importance to reduce the series resistance of a transistor for given design dimensions as much as possible so as to combine moderately high drive current capability with increased switching speed for sophisticated logic circuits.

Hence, it becomes an important design goal to increase the conductivity of lines and contact regions, such as drain and source regions, gate electrodes, polysilicon interconnect lines and the like, since the cross-sectional area of these lines and regions is also reduced as the general transistor dimensions are decreased. The cross-sectional area, however, determines, in combination with the characteristics of the material comprising the conductive lines and contact regions, the resistance of the respective line or contact region. As a result, in highly scaled semiconductor devices, the conductive lines and contact regions may exhibit a higher resistance unless the reduced cross-section is compensated for by improving the electrical characteristics of the material forming the lines and contact regions, such as the gate electrode, and the drain and source contact regions.

It is thus of particular importance to improve the characteristics of conductive regions that are substantially comprised of semiconductor material such as silicon. For instance, in modern integrated circuits, the individual semiconductor devices, such as field effect transistors, capacitors and the like, are primarily based on silicon, wherein the individual devices are connected by silicon lines and metal lines. While the resistivity of the metal lines may be improved by replacing the commonly used aluminum by, for example, copper and copper alloys, process engineers are confronted with a challenging task when an improvement in the electrical characteristics of silicon-containing semiconductor lines and semiconductor contact regions is required.

With reference to FIGS. 1a-1b, an exemplary process for manufacturing an integrated circuit containing, for example, a plurality of MOS transistors, will now be described in order to illustrate the problems involved in improving the electrical characteristics of silicon-containing semiconductor regions in more detail.

FIG. 1a schematically illustrates a cross-sectional view of a semiconductor structure 100 that includes a substrate 101, for example, a silicon substrate above which is formed a field effect transistor 110 of a specified conductivity type, such as an N-channel transistor or a P-channel transistor. The semiconductor structure 100 comprises an isolation structure 113 formed of an insulating material, such as silicon dioxide, silicon nitride and the like, which defines an active region 112 in the substrate 101. In advanced semiconductor devices, the isolation structure 113 may be provided in the form of a shallow trench isolation (STI), filled, at least partially, with one or more appropriate insulating materials, for instance as specified above. A gate electrode 115 having a gate length 115L is formed over a gate insulation layer 118 that separates the gate electrode 115 from the active region 112. Spacer elements 116 made of, for example, silicon dioxide or silicon nitride, are located at the sidewalls of the gate electrode 115. In the active region 112, source and drain regions 114, including respective extensions 114a, are formed and exhibit an appropriate lateral dopant profile required to connect to a channel region 111, in which a conductive channel builds up between the drain and the source regions 114 upon application of an appropriate control voltage on the gate electrode 115. Moreover, metal silicide regions 117 are formed within the drain and source regions 114 and on the gate electrode 115. The metal silicide regions 117 may be comprised of any appropriate metal silicide, based on an appropriate refractory metal, such as titanium, cobalt, nickel, platinum, tungsten or combinations thereof.

FIG. 1b schematically illustrates a top view of the semiconductor structure 100. As shown, the gate electrode 115 extends in the transistor width direction, indicated as W, beyond the active region 112 (the area within the isolation structure 113) into the insulated portion of the substrate 101 defined by the shallow trench isolation structure 113. Depending on the circuit layout, the gate electrode 115 may connect to an adjacent transistor or to a respective contact region (not shown). As previously discussed, the gate length 115L of the transistor element 110 substantially determines the channel length of the transistor 110 and, therefore, as previously pointed out, significantly affects the electrical characteristics of the transistor element 110. The transistor width is defined by the dimension of the active area 112 along the width direction W and is therefore determined by the trench isolation structure 113. For a given gate length 115L determining the resistance per unit length in the direction of current flow and the switching speed, the transistor width also affects the drive current capability. However, as previously explained, in view of packing density and reduced overall switching speed, the transistor width may not be arbitrarily increased.

A typical process flow for forming the semiconductor structure 100 as depicted in FIGS. 1a-1b may comprise the following processes. After the formation of the trench isolation structure 113 by well-known photolithography, etch, deposition and planarization techniques, implantation steps may be performed to create a vertical dopant profile in the active region 112 according to device requirements. Subsequently, the gate insulation layer 118 is formed according to design requirements, after cleaning the exposed surface of the active area 112. Thereafter, the gate electrode 115 may be formed by patterning, for instance, a polysilicon layer by means of sophisticated photolithography and etch techniques. Then, a further implantation step for forming the source and drain extensions 114a within the source and drain regions 114 may be performed, for instance, on the basis of appropriate offset spacers (not shown) and then the spacer elements 116 may be formed by deposition and anisotropic etch techniques. The spacer element 116 may be used as an implantation mask for a subsequent implantation process in which a dopant is implanted into the active region 112 to form the source and drain regions 114, thereby creating the required high dopant concentrations in these regions. Typically, appropriate anneal processes are performed to activate the dopants and to reduce implantation-induced lattice defects. Thereafter, the metal silicide regions 117 may be formed by well-established techniques including, for example, the deposition of a suitable refractory metal and performing a heat treatment in order to initiate a silicidation process. A suitable low ohmic phase may be obtained by a further heat treatment in accordance with established techniques. It should be appreciated that the resulting sheet resistance of the metal silicide regions 117 is significantly less compared to the resistance of the semiconductor materials of the drain and source regions 114 and the gate electrode 115, although these areas are heavily doped. Consequently, by providing the metal silicide regions 117, the reduced cross-sectional area of the contact regions, i.e., the silicided portions of the drain and source regions 114, and polysilicon lines, such as the gate electrode 115, may be compensated for to reduce the parasitic resistance despite the overall reduced transistor dimensions.

In view of a further reduction of the series resistance between the channel region 111 in its conducting state and the surface areas of the metal silicide regions 117, at which respective metal plugs may contact the transistor 110, it would be desirable to increase, for a given transistor configuration, the amount of metal silicide within the drain and source regions 114, wherein, however, for advanced applications, the depth of the metal silicide regions 117, although highly desirable in the gate electrode 115, may not be significantly increased without a high risk for shorting the drain and source regions 114 with the active area 112, thereby causing a device failure. Due to the limited depth of the metal silicide region 117 in the drain and source regions 114, it is thus important to provide a high quality metal silicide within the entire area of the drain and source regions 114. In conventional approaches, however, the metal silicide at the interface between the drain and source regions 114 and the trench isolation structure 114, indicated as 113A, may have a reduced thickness, thereby reducing the efficiency of the metal silicide, since, in total, a moderately large area (see FIG. 1b) may suffer from a reduced metal silicide thickness.

The present disclosure is directed to various methods and systems that may solve, or at least reduce, some or all of the aforementioned problems.

SUMMARY OF THE INVENTION

The following presents a simplified summary of the disclosure in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

The present disclosure is directed to a technique that enables the formation of metal silicide regions in a highly doped semiconductor region containing silicon, which is enclosed by an isolation structure. For this purpose, the surface area in the active semiconductor area available for a silicidation reaction may be increased at the interface between the isolation structure and the active semiconductor area, thereby significantly increasing the amount of highly conductive metal silicide. Consequently, the overall series resistance may be reduced. Moreover, in some illustrative embodiments, the increased surface area at the interface may be formed prior to forming a gate electrode structure, which may therefore also be positioned close to the exposed sidewall portion of the active semiconductor area, thereby enhancing the efficiency of the gate electrode structure in creating a conductive channel at the interface between the active semiconductor area and the isolation structure. In this way, the effective channel width of a transistor may be increased, thereby also contributing to a performance increase compared to a conventional transistor having the same design dimensions.

According to one illustrative embodiment disclosed herein, a method comprises forming a first trench isolation structure to define a first active semiconductor area in a silicon-containing semiconductor layer formed above a substrate. The method further comprises exposing a portion of a sidewall of the active semiconductor area, while a non-exposed portion of the sidewall defines an interface with the trench isolation structure. Moreover, a metal silicide for a circuit element is formed in the silicon-containing semiconductor layer.

According to another illustrative embodiment, a method comprises forming an isolation structure in a silicon-containing semiconductor layer to define an active semiconductor area. Furthermore, at least a portion of the isolation structure is recessed so as to obtain a lower height level of the recessed portion relative to a height level defined by a surface of the active semiconductor area. Moreover, a metal silicide is formed in a portion of the active semiconductor area.

According to yet another illustrative embodiment, a semiconductor device comprises an isolation structure formed in a silicon-containing semiconductor layer, wherein the isolation structure defines an active semiconductor area in the silicon-containing semiconductor layer. Furthermore, a metal silicide region is formed in a portion of the active semiconductor area, wherein the metal silicide has a maximum thickness at an interface formed between the isolation structure and the active semiconductor area.

BRIEF DESCRIPTION OF THE DRAWINGS

The disclosure may be understood by reference to the following description taken in conjunction with the accompanying drawings, in which like reference numerals identify like elements, and in which:

FIG. 1b schematically shows a top view of the transistor of FIG. 1a;

Figure 1A:
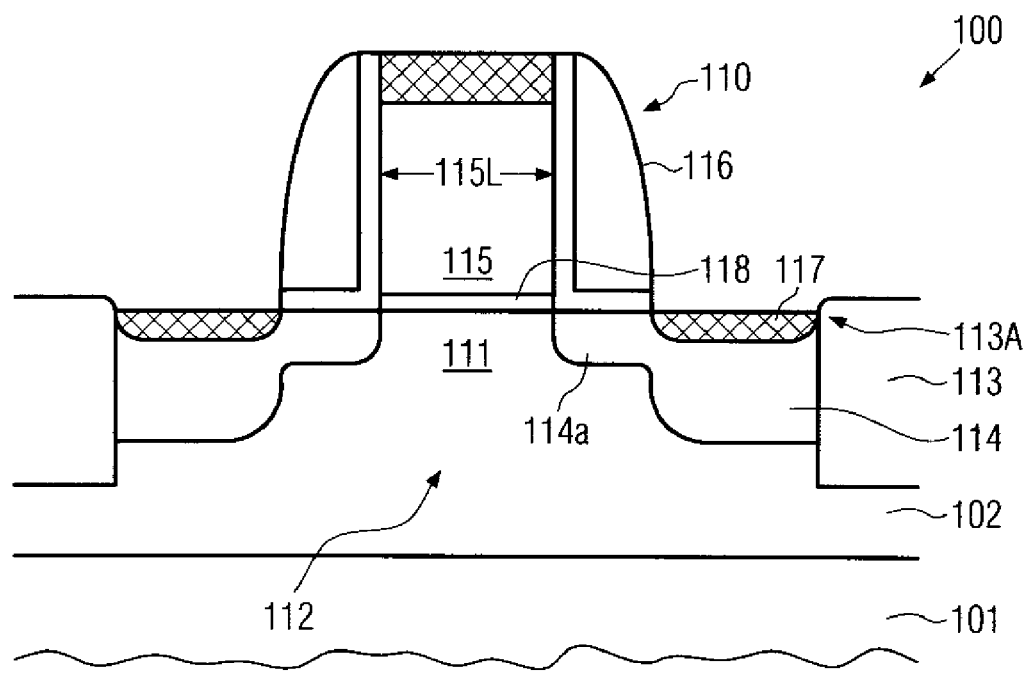
FIG. 1a schematically shows a cross-sectional view of a conventional transistor with a metal silicide region formed according to a conventional process flow.
Figure 1B:
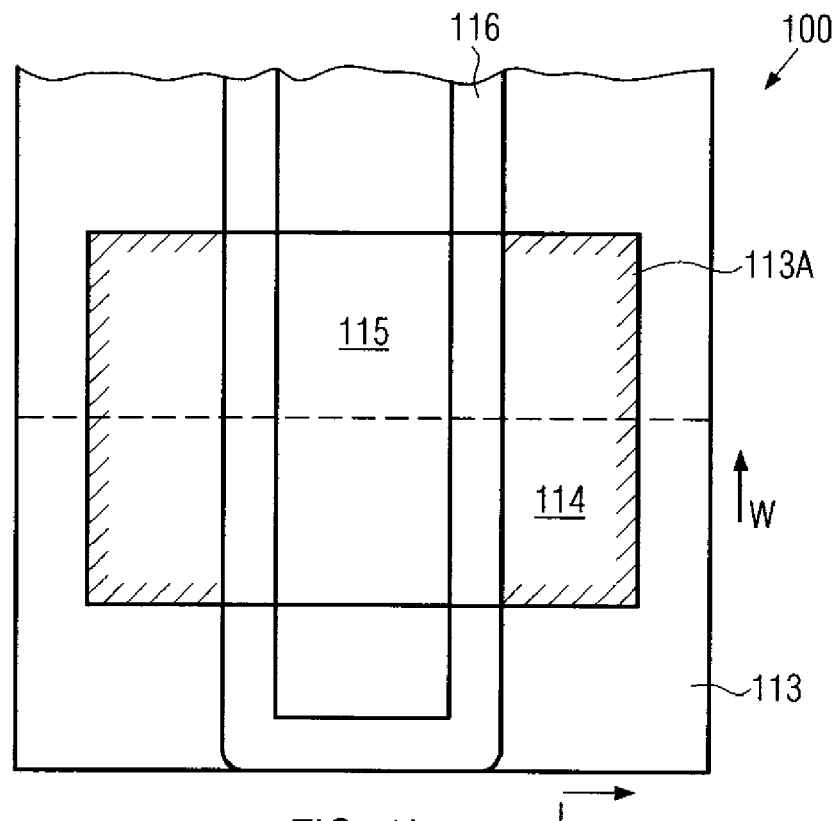

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present disclosure will now be described with reference to the attached figures. Various structures, systems and devices are schematically depicted in the drawings for purposes of explanation only and so as to not obscure the present invention with details that are well known to those skilled in the art. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the present disclosure relates to a technique for enhancing the drive current capability of a circuit element, such as a field effect transistor, for given design dimensions by increasing the amount of metal silicide that may be formed in an active semiconductor area enclosed by an isolation structure. For this purpose, the surface area of the active semiconductor area in the vicinity of the isolation structure that is available during a silicidation process may be increased, thereby contributing to an overall reduction of the resistance of the active semiconductor area. The increasing of the surface area may be achieved by exposing a portion of a sidewall of the active semiconductor area at any appropriate manufacturing stage prior to performing the silicidation process, wherein, in some illustrative embodiments, one or more etch or cleaning processes may be appropriately modified so as to also expose the upper sidewall portion of the active semiconductor area, thereby obtaining a high degree of compatibility with conventional process techniques. For field effect transistors, the process of exposing, or at least one step of the process of exposing, the upper sidewall portion may be performed prior to forming the gate electrode. In this case, the gate electrode may "wrap" around the active semiconductor area due to the exposed upper sidewall portion, thereby providing an increased control effect on the channel region, which may result in an enhanced conductivity of the channel in the vicinity of the isolation structure. Hence, the effective channel width may be increased compared to a conventional transistor having otherwise substantially the same design configuration. Since the exposure of the upper sidewall portion of the active semiconductor area may be performed at any desired manufacturing stage, the degree of recessing of the isolation structure for obtaining the increased effective channel width and the increasing of the surface area for obtaining a thicker metal silicide may, in some illustrative embodiments, be decoupled from each other by additionally recessing the isolation structure after the formation of the gate electrode.

With reference to the accompanying drawings, further illustrative embodiments will now be described in more detail. It should be appreciated that any statements with respect to the position of a component are to be understood as relative positions, wherein the reference is defined by a corresponding substrate. That is, any position information, such as horizontal, vertical, lateral and the like, are to be understood with reference to the substrate above which is formed a corresponding semiconductor device. Hence, vertical is a direction substantially perpendicular to the substrate surface, while horizontal is substantially parallel to the substrate surface. Similarly, terms like "below," "under," "above," "lower," "higher," "deeper" and the like should be understood by using the substrate as basis. Hence, a first component is "above" a second component, when the distance of the second component to the substrate surface is less than the distance of the first component. Thus, the "height level" of the first component is higher compared to the height level of the second component.

Figure 2A:
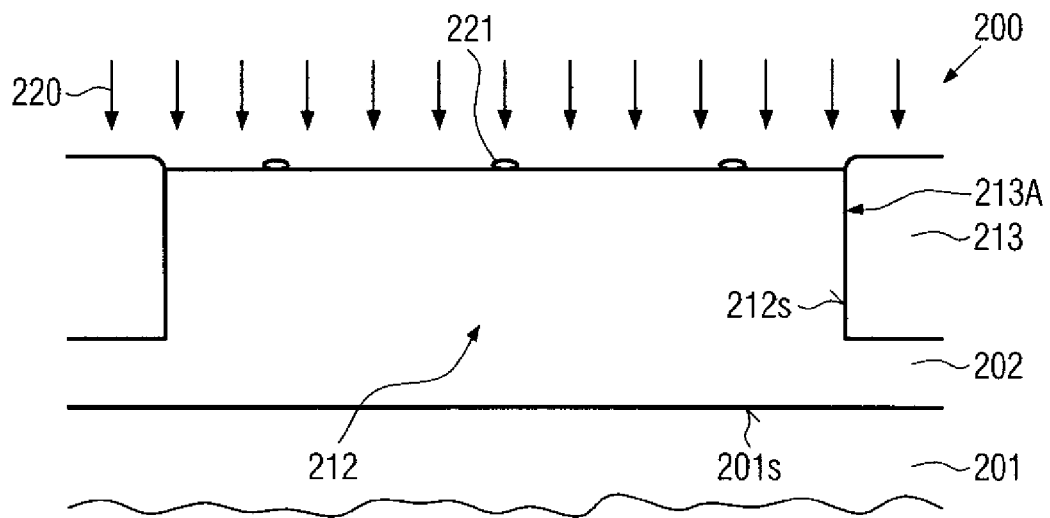
FIGS. 2a-2e schematically illustrate cross-sectional views of a transistor element during various manufacturing stages for recessing an isolation structure at an early state.

FIG. 2a schematically shows a cross-sectional view of a semiconductor device 200 comprising a substrate 201 having a substrate surface 201s, which may represent any appropriate substrate for the formation of silicon-based semiconductor elements. For instance, the substrate 201 may represent a bulk silicon substrate having formed on an upper portion thereof a crystalline silicon layer. In other cases, the substrate 201 may represent a silicon-on-insulator (SOI) substrate having formed above an insulating layer (not shown) a silicon-containing semiconductor layer. The semiconductor device 200 may further comprise an isolation structure 213 formed above the substrate 201 within a silicon-containing semiconductor layer 202 so as to define an active semiconductor area 212. An active semiconductor area is to be understood as a doped or undoped semiconductor region, in which respective PN junctions are formed or are to be formed. In the illustrative embodiment shown, the active semiconductor area 212 may represent an active semiconductor area for a transistor element, wherein the cross-section of FIG. 2a shows the transistor length direction.

A typical process flow for the semiconductor device 200 as shown in FIG. 2a may comprise the following processes. After forming the silicon-containing semiconductor layer 202, or providing the substrate 201 having formed thereon the layer 202, for instance when an SOI architecture is considered, the isolation structure 213 may be formed on the basis of well-established techniques. In one illustrative embodiment, the isolation structure 213 may represent a trench isolation structure and may be formed by forming a trench by photolithography and anisotropic etch techniques, followed by forming an appropriate insulating material, at least partially, in the trench in order to obtain the desired insulating behavior. The insulating material, which may in one illustrative embodiment comprise silicon dioxide, may be formed by deposition and oxidation or other techniques providing the required fill behavior. Thus, the isolation structure 213 defines an interface 213A with a sidewall 212s of the active semiconductor area 212. Thereafter, the semiconductor device may be subjected to a cleaning process 220 for removing contaminants resulting from the preceding processes, such as a planarization process for removing excess material, and also for removing oxide residues, such as a native oxide that may have grown on the surface of the active semiconductor area 212. The cleaning process 220 may, in one illustrative embodiment, be designed as a wet chemical process on the basis of a chemistry for removing silicon dioxide selectively to silicon. Hence, during the process 220, oxide residues 221 may be efficiently removed, while material from the isolation structure may also be removed when comprised of silicon dioxide. The process 220 may, for a given composition of the chemicals and for otherwise specified process conditions, such as temperature, be controlled on the basis of etch time in order to obtain a desired degree of material removal in the isolation structure 213, while substantially no material removal occurs in the active semiconductor area 212 due to the high etch selectivity of the process 220. Suitable wet chemical etch techniques for silicon and silicon dioxide are well established in the art and may be used in the embodiment shown. For instance, diluted hydrofluoric acid (HF) may be used.

Figure 2B:
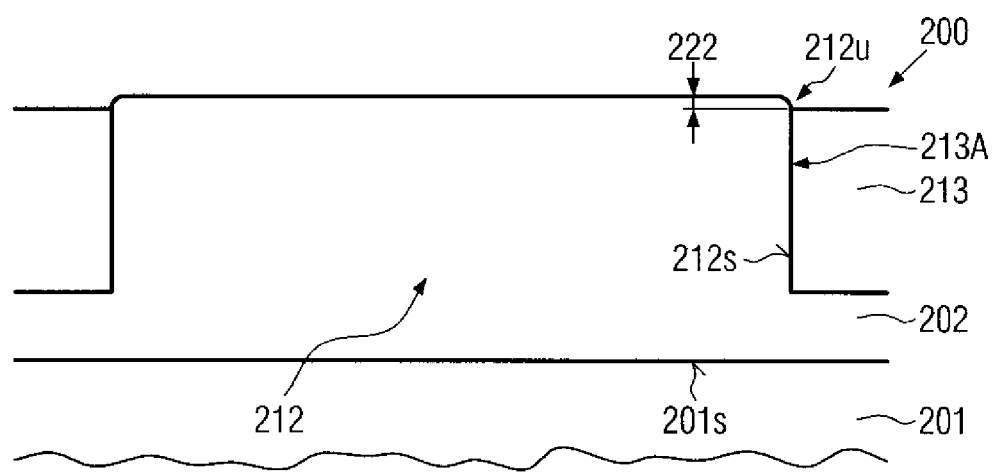

FIG. 2b schematically illustrates the semiconductor device 200 after the completion of the process 220. Hence, the isolation structure 213 may be recessed to a specified height level relative to the surface of the active semiconductor area 212, thereby creating a height difference in accordance to a specified target value 222 for this manufacturing stage. Thus, an upper portion 212u of the sidewall 212s is exposed during the subsequent processing of the device 200. In one embodiment, the height difference 222 may be selected in such a way that a desired degree of "wrap around" of a gate structure still to be formed above the active semiconductor area 212 and a portion of the isolation structure 213. For example, the height difference may range from approximately 1-10 nm for advanced applications including transistor elements having a gate length of 100 nm and significantly less. In some illustrative embodiments, when a bulk transistor configuration is considered, the depth of the isolation structure 213 may be appropriately selected so as to compensate for a "loss" of depth due to the recessing by forming a trench having an increased depth in order to maintain a threshold voltage of a parasitic channel below the isolation structure at a desired low value.

Figure 2C:
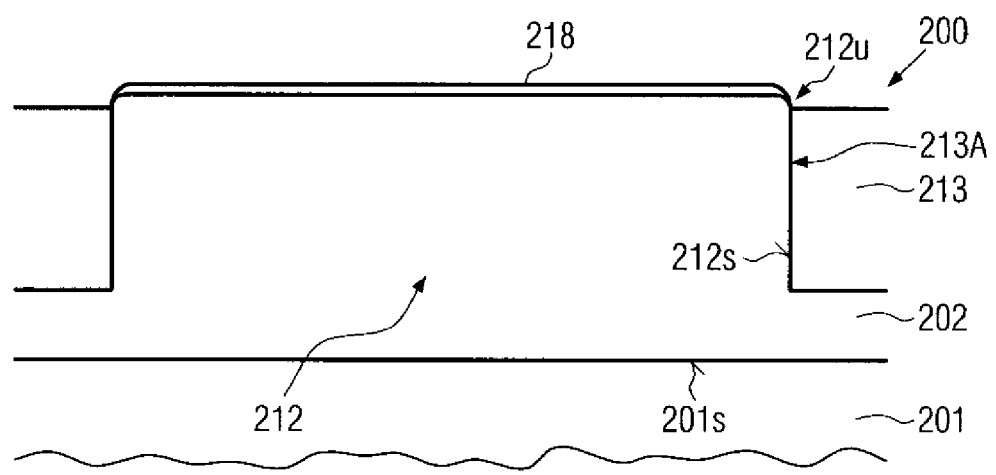

FIG. 2c schematically depicts the semiconductor device 200 with a gate insulation layer 218 formed at least on exposed surface portions of the active semiconductor area 212. For example, the gate insulation layer 218 may be formed on the basis of advanced oxidation techniques, when the gate insulation layer 218 is comprised, at least partially, of silicon dioxide. In this case, the isolation structure 213 may substantially maintain its height level as substantially no oxide material is formed thereon, while a part of the exposed surface area of the active semiconductor area 212 is consumed by the oxidation process. In other embodiments, the gate insulation layer 218 may be formed be deposition, possibly in combination with one or more oxidation processes, and the gate insulation layer 218, or at least a part thereof, may also be formed on the isolation structure 213. In some illustrative embodiments, the thickness of the gate insulation layer 218, when formed by deposition, may be taken into consideration when selecting the target value 222 (FIG. 2b) in order to obtain a required height difference after the deposition of the gate insulation layer 218 on the isolation structure 213. For example, high-k dielectric materials may be used, which may allow the formation of the gate insulation layer 218 with increased thickness compared to a layer comprised of silicon dioxide and/or silicon nitride.

Figure 2D:
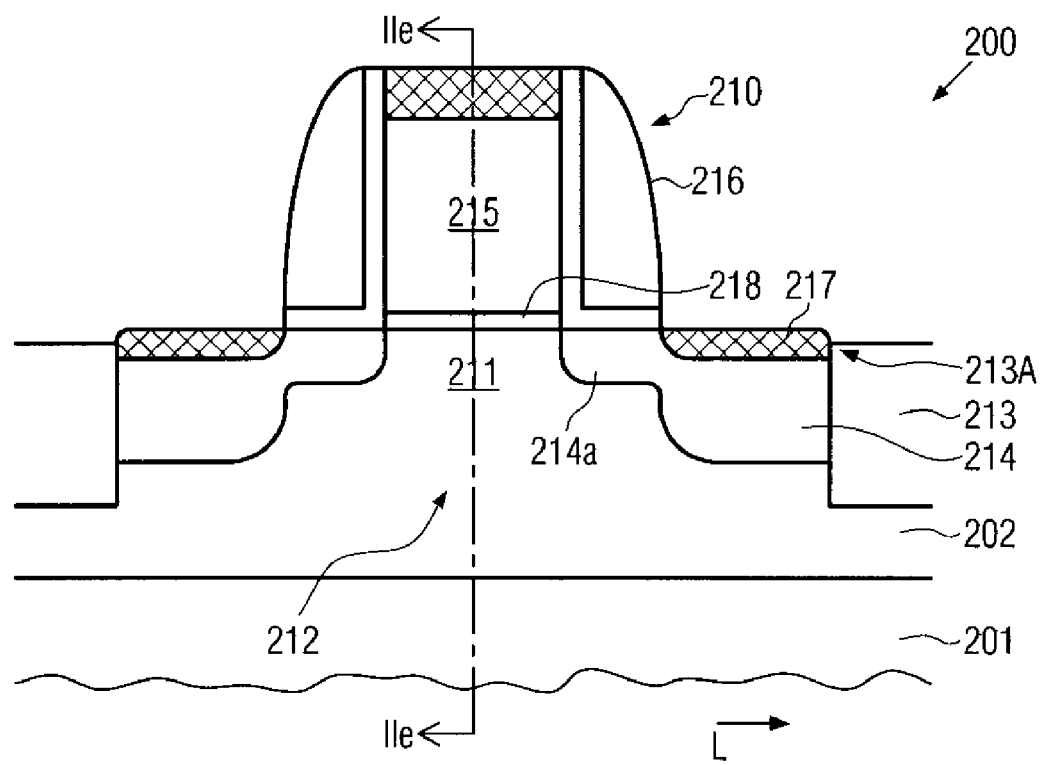

FIG. 2d schematically illustrates the semiconductor device 200 in a further manufacturing stage, in which, in one illustrative embodiment, a transistor 210 is formed in and above the active semiconductor area 212 and partially above the isolation structure 213. In other embodiments, the transistor 210 may represent other circuit elements, such as a conductive semiconductor line, a capacitor and the like. As shown, a gate electrode 215, which may represent a semiconductor line in other embodiments, is formed above the active semiconductor area 212 and partially above the isolation structure 213, and is, at least within the active semiconductor area 212, separated therefrom by the gate insulation layer 218. A channel region 211 is formed within the active semiconductor area 212 and below the gate insulation layer 218 and laterally separates portions of the active semiconductor area 212, in which deep drain and source regions 214 including extension regions 214a may be formed. A sidewall spacer structure 216 may be formed at a sidewall of the gate electrode 215, wherein the spacer structure 216 may have any configuration as required by process and device requirements. It should be appreciated that the transistor configuration as shown by referring to the transistor 210 may represent any architecture used in advanced semiconductor devices. For example, the channel region 211 may have formed therein a strained semiconductor material in order to increase charge carrier mobility and hence increase the drive current capability in addition to the mechanism of an increased metal silicide contents and/or an increased effective transistor width, as will be described later on in more detail. For this purpose, any suitable strain-inducing mechanism may be used in the transistor 210, such as a strained semiconductor material in the drain and source regions 214, which may for instance be provided in the form of silicon/germanium or silicon/carbon in order to generate compressive and tensile strain, respectively, in the channel region 211. Consequently, unless specifically pointed out in the specification and/or the appended claims, the present invention should not be considered as being restricted to a specific transistor configuration.

Moreover, the semiconductor device 200 comprises metal silicide regions 217 in the drain and source regions 214 and in the gate electrode 215. The metal silicide regions 217 may comprise any appropriate metal or a combination of metals, such as cobalt, nickel, titanium, platinum, tungsten and the like. The metal silicide regions 217 formed in the drain and source regions 214 may have a thickness that may vary along the transistor length direction, i.e., in FIG. 2d, the horizontal direction indicated as L, and may have, in some illustrative embodiments, a maximum value at the interface 213A due to the increased surface area provided by the exposed upper portion 212u (FIG. 2b) that is available for the silicidation reaction. Irrespective of the manufacturing technique used for forming the metal silicide regions 217 within the drain and source regions 214, an increase of the total amount of metal silicide, in particular in the vicinity of the interface 213A, may be obtained compared to a conventional device, such as the transistor 110. Hence, the overall series resistance of the drain and source regions 214 may be reduced compared to a transistor having the same design dimensions. It is to be noted that the thickness of the metal silicide regions 217 within the drain and source regions 214 is to be understood as an "average" thickness in the sense that an interface roughness or any other irregularities of the interface between the metal silicide and the remaining drain and source regions 214 may not be taken into consideration or may be incorporated by using an appropriate mean value for the interface roughness.

A typical process flow for forming the semiconductor device 200 as shown in FIG. 2d may comprise the processes similarly as described with reference to FIG. 1a when describing the manufacturing sequence of the transistor 110. It should be appreciated that, if a high degree of compatibility with well-established techniques is desired, any appropriate well-established sequence may be selected for forming the transistor 210. Thus, any advanced techniques with respect to the formation of strained semiconductor material, sophisticated implantation and/or in situ doping techniques, modern activation and re-crystallization anneal processes, such as laser- or flash-based techniques, if required, may be used. However, in the embodiment shown, after forming the gate insulation layer 218, a gate electrode material, such as polysilicon and the like, may be formed, for instance by deposition, wherein the corresponding gate electrode material may also be formed above the isolation structure 213 and may therefore conform to the step created by the difference in height (see FIG. 2b). Hence, after the patterning of the gate electrode 215, a portion of the gate electrode 215 may be positioned at a lower height level compared to a portion of the gate electrode 215 formed above the active semiconductor area 212, as will be shown in more detail in FIG. 2e.

Figure 2E:
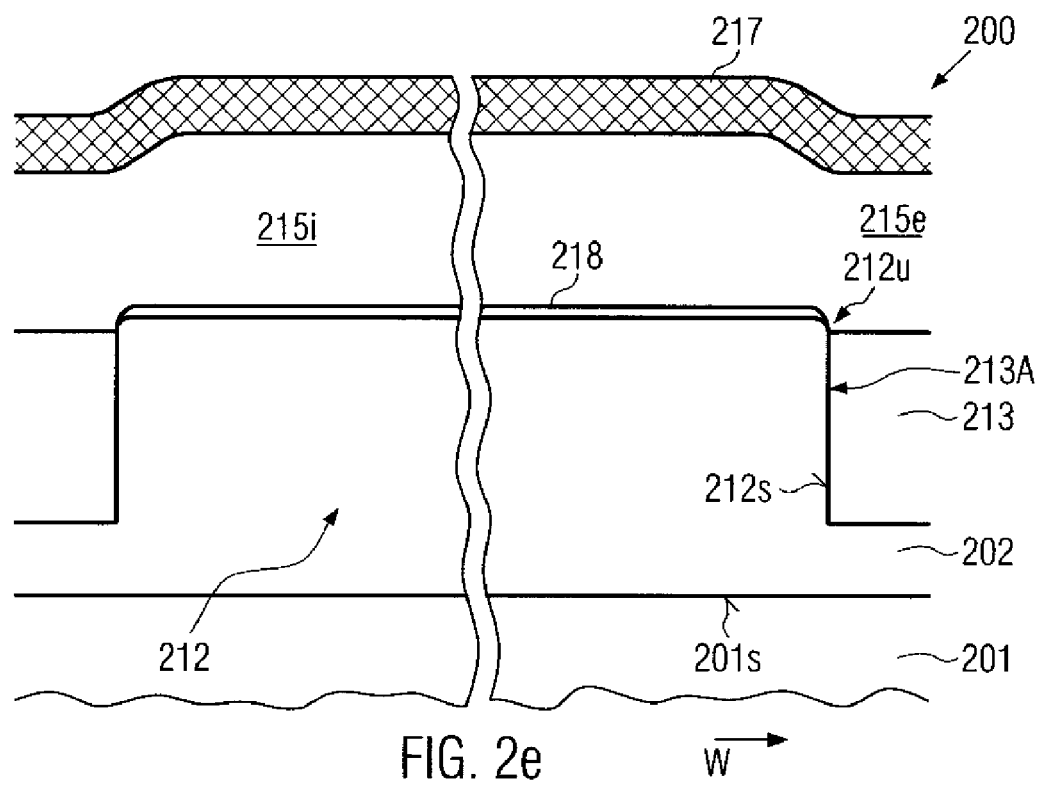

FIG. 2e schematically illustrates the semiconductor device 200 in a cross-section as indicated in FIG. 2d. Hence, the gate electrode 215 is "cut" and viewed from the transistor width direction, indicated as W. As shown, the gate electrode 215 has an inner portion 215i located above the active semiconductor area 212, and an outer portion 215e formed above the isolation structure 213 and may be wrapped around the portion 212u of the active semiconductor area 212. Therefore, the outer portion 215e is lower in height and is thus positioned closer to the lateral end of the channel region 211 compared to a conventional device having a substantially flush configuration or even an increased height at the side of the isolation structure 213. Consequently, upon application of an appropriate control voltage to the gate electrode 215, the resulting electric field is transferred more effectively into the channel region 211 at the interface 213A, thereby also creating an efficient channel in this area of the channel region 211, while, in conventional configurations, this portion of the channel region would not efficiently contribute to the total current flow. Hence, an increase of the effective channel width may be achieved.

In the process flow described above, the degree of exposure of the portion 212u (FIG. 2b) may be selected in such a manner that a desired amount of height difference between the inner portion 215i and the outer portion 215e is achieved, wherein the degree of exposure of the upper sidewall portion 212u during the silicidation process is also adjusted. In other embodiments, after recessing the isolation structure 213 prior to the formation of the gate electrode 215, a further process for recessing the isolation structure 213 may be performed in a later stage by any suitable etch process so as to adjust a higher degree of silicide increase at the interface 213A, if desired. For example, when a spacer is formed, for instance an offset spacer, as will be described later on in more detail, the respective etch process may be modified so as to achieve a desired further recessing of the isolation structure 213. Moreover, in order to maintain the influence of the additional material removal small with respect to other components, such as the spacer, a plurality of respect removal steps may be performed at appropriate processes in order to obtain in total the required overall recessing of the isolation structure 213 without a significant influence on other components.

Figure 3A:
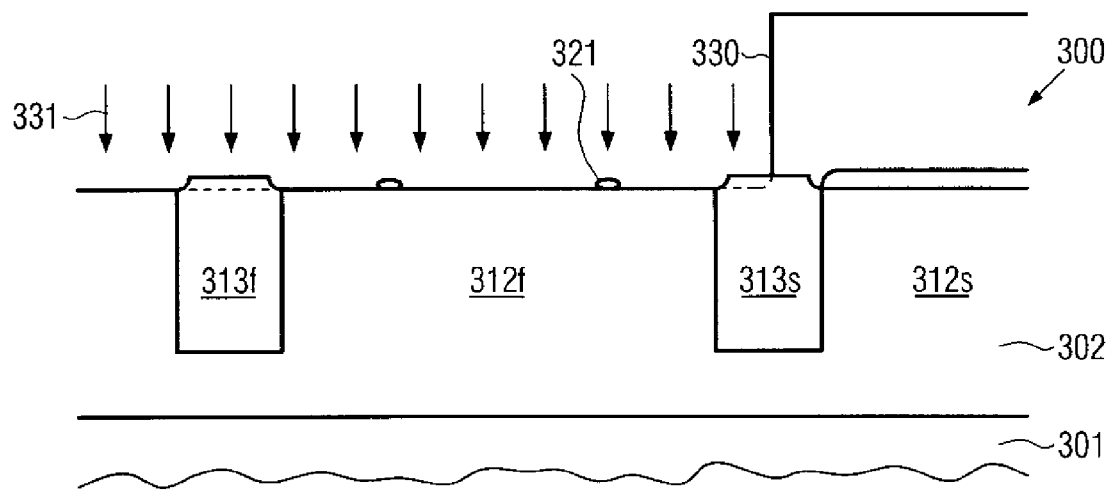
FIGS. 3a-3c schematically show cross-sectional views of a semiconductor device receiving gate insulation layers of different thickness with an intermittent recessing of the isolation structure.
Figure 3B:
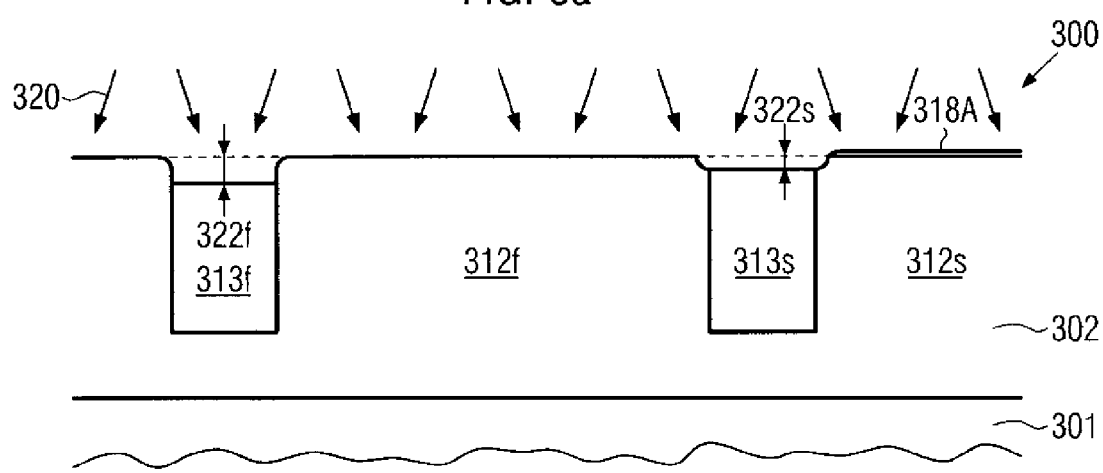
Figure 3C:
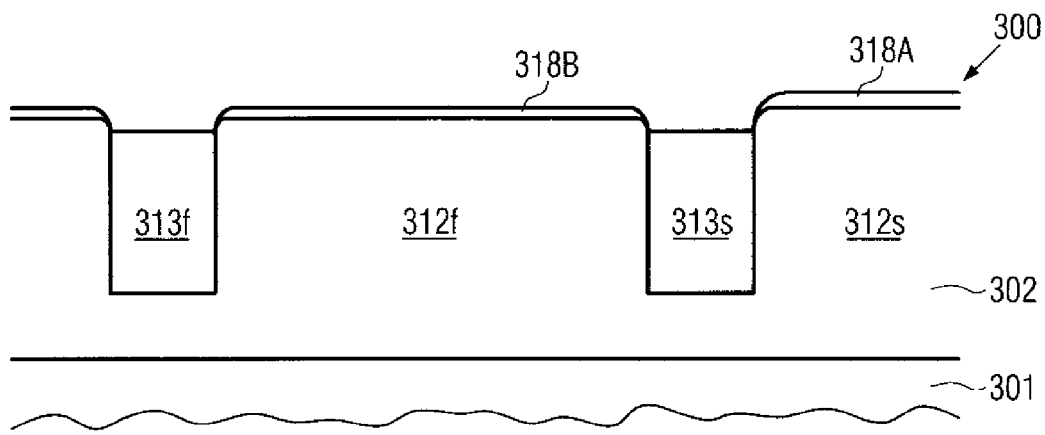

With reference to FIG. 3a-3c, further illustrative embodiments will now be described, in which one or more steps for recessing an isolation structure are performed prior to the formation of a gate electrode when gate insulation layers of different thicknesses may be required at different device regions.

FIG. 3a schematically illustrates a cross-sectional view of a semiconductor device 300 comprising a first isolation structure 313f and a second isolation structure 313s formed in a silicon-containing semiconductor layer 302 that is formed above a substrate 301. The first and second isolation structures 313f, 313s may define a first and second active semiconductor areas 312f, 312s. Regarding the characteristics of the first and second isolation structures 313f, 313s, and of the components 301, 302, 312f, 312s, the same criteria apply as previously pointed out with reference to the device 200. Furthermore, the semiconductor device 300 may comprise a first sub-layer 318A of a gate insulation layer still to be formed. For example, the sub-layer 318A may be comprised of silicon dioxide having a thickness of several nanometers, depending on the further processing.

In one embodiment, the isolation structures 313f, 313s may have been recessed in a first step prior to forming the first sub-layer 318A, wherein a further material removal may be desired for one or both of the isolation structures 313f, 313s. After the optional recessing of the isolation structures 313f, 313s, the sub-layer 318A may be formed by any appropriate technique, such as oxidation, when a silicon dioxide layer is to be formed. Thereafter, an etch mask 330 may be formed to expose the first active semiconductor area 313f while covering the second active semiconductor area 313s, and a selective etch process 331 may be performed to remove the exposed portion of the sub-layer 318A, or at least partially remove this portion. In some illustrative embodiments, the etch process 331 may be designed to also remove a desired amount of material of the first isolation structure 313f, and, depending on the circuit layout, of the second isolation structure 313s. To this end, the etch time of the process 331 may be selected to obtain the desired recessing. In other embodiments, when the thickness of the sub-layer corresponds to a target thickness for the further processing, the etch process may include an appropriate cleaning process for removing oxide residuals 321, as is also described with reference to the device 200.

FIG. 3b schematically illustrates the device 300 according to further illustrative embodiments, in which, after removing a desired portion of the sub-layer in the first active semiconductor area 313f, or after reducing the thickness thereof by means of the etch process 331 based on the mask 330, a common cleaning process 320 may be performed in order to remove oxide residues in the first active semiconductor area 313f, while also reducing the thickness of the sub-layer 318A in the second active semiconductor area 312s to a desired target value and further removing material from the first and second isolation structures 313f, 313s. Thus, by performing one or more of the above-described sequences, a high degree of flexibility for generating a recessed isolation structure may be obtained, wherein the degree of recessing may be selected differently for different isolation structures, without significantly contributing to process complexity. For example, the recessing 322s in the second isolation structure 313s may be less compared to the recessing 322f in the first isolation structure 313f.

FIG. 3c schematically illustrates the device 300 with a second sub-layer 318B, which may be formed by a further oxidation process or any other process for forming a gate insulation layer. Moreover, the sub-layer 318A may now have the finally desired target thickness as required for the fabrication of respective transistor elements thereon. Hence, the further processing may be continued as also described with reference to the devices 100 and 200, wherein the same advantages with respect to increasing transistor performance may be achieved as described above, wherein the respective characteristics may be adjusted differently for the transistors having the differently thick gate insulation layers 318A, 318B.

Figure 4A:
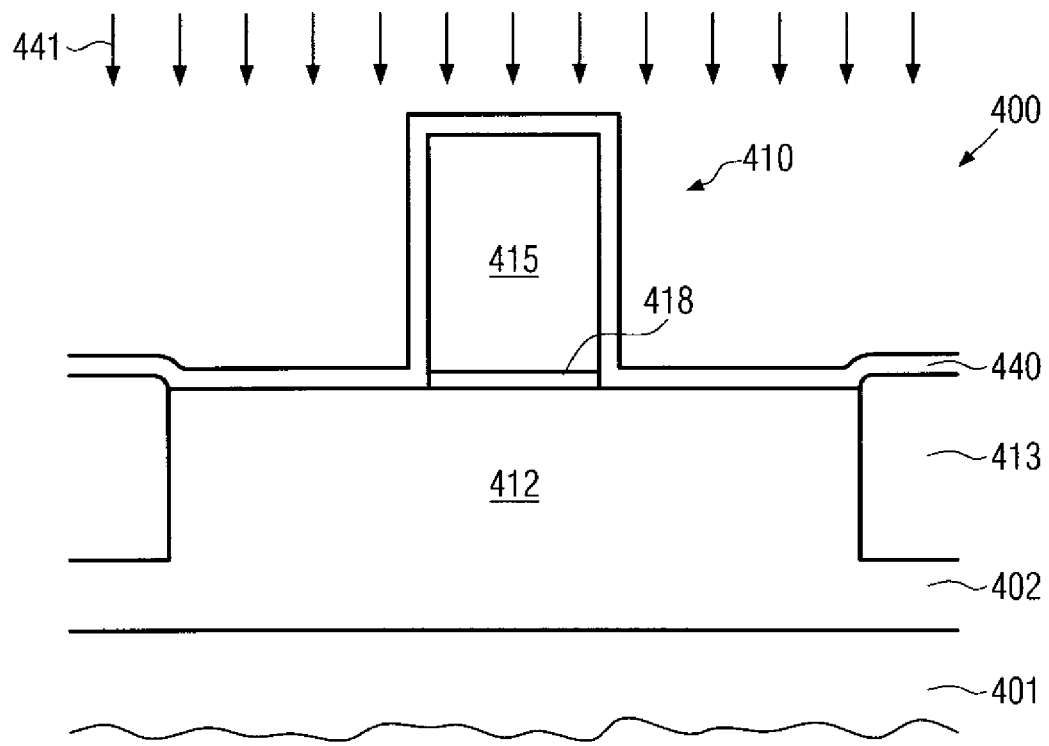
FIGS. 4a-4b schematically show a cross-sectional view of a transistor element during different manufacturing stages, wherein an isolation structure is recessed during a spacer etch process.
Figure 4B:
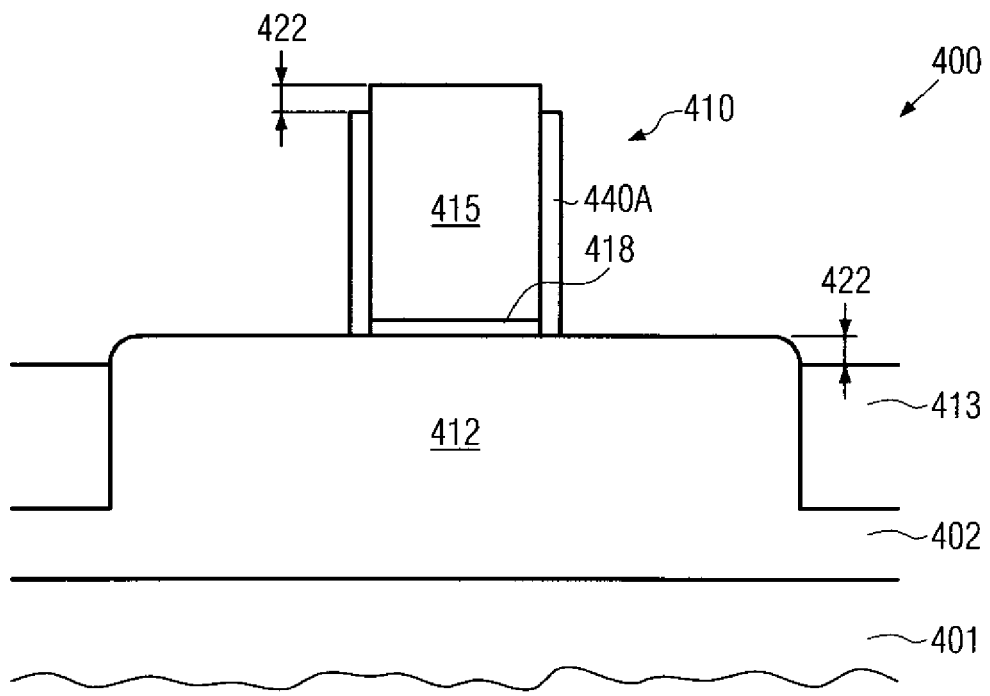

With reference to FIGS. 4a-4b, further illustrative embodiments will now be described, in which one or more steps for recessing an isolation structure are performed after the formation of a gate electrode.

FIG. 4a schematically illustrates a cross-sectional view of a semiconductor device 400 comprising an isolation structure 413 formed in a silicon-containing semiconductor layer 402 that is formed above a substrate 401. The isolation structure 413 may define an active semiconductor area 412 within the semiconductor layer 402. A gate electrode 415 may be formed above the active semiconductor area 412 and at least partially in the transistor width direction above the isolation structure 413, wherein the gate electrode 415 may, at least above the active semiconductor area 412, be separated therefrom by a gate insulation layer 418. Regarding the characteristics of the isolation structure 413 and of the components 401, 402, 412, 415, 418, the same criteria apply as previously pointed out with reference to the device 200. Furthermore, the semiconductor device 400 may comprise a spacer layer 440, which may be comprised of any appropriate material, wherein, in one embodiment, the layer 440 is formed of a material having a comparable etch rate with respect to an anisotropic etch process 441 relative to the material of the isolation structure 413. For example, the spacer layer 440 may be formed by any appropriate deposition technique and may be comprised of silicon oxide, when the isolation structure is also comprised of silicon oxide. In general, in this illustrative embodiment, the material of the layer 440 and the isolation structure 413 may exhibit similar etch characteristics, or at least material of the isolation structure may be etched with a high selectivity compared to the material of area 412. During the anisotropic etch process 441, the material of the spacer layer 440 located on horizontal surface portions may be removed, wherein a desired over-etch time may be applied in order to also recess the isolation structure to a desired degree. In this case, the initial thickness of spacer layer 440 may be selected so as to compensate for a certain reduction in thickness of vertical layer portions formed on sidewalls of the gate electrode 415, since a certain isotropic etch component may be present during the process 441. Since the etch process 441 may be used in conventional process sequences for forming offset spacers, the respective additional deposition time for forming the layer 440 may be readily determined on the basis of well-established recipes.

FIG. 4b schematically illustrates the device 400 after completion of the etch process 441. Hence, a respective spacer element 440A may be formed on the sidewalls of the gate electrode 415, wherein a degree of recessing in the isolation structure 413, indicated as 422, may substantially also occur at the gate electrode 415 for the spacers 440A due to the additional over-etch time. In other illustrative embodiments, the material removal during the etch process 441 may represent one step of two or more process steps for recessing the isolation structure 413, so that the degree of recessing 422 in the isolation structure may represent the sum of all previously performed recess steps including the etch process 441, which may then result in a significantly reduced material removal and thus a reduced recess of the spacer 440A. In this way, the total degree of recessing may be "divided" into a plurality of less intensive steps, wherein the influence of each step on other device components, such as the spacer 440A, is less pronounced. For example, if a certain degree of recessing may be desired prior to the formation of the gate electrode 415 for achieving an increased effective channel width, as described above with reference to the device 200, one or more of the above process sequences may have been performed and the recessing by the process 441 may result in an additional moderate increase of the height difference.

The further processing may then be continued in a similar manner as described above, wherein, contrary to conventional process flows, in some embodiments, further steps for further recessing the isolation structure 413 may be performed prior to forming respective metal silicide regions.

With reference to FIGS. 5a-5d, further illustrative embodiments will now be described, in which a portion of an isolation structure adjacent to the active semiconductor area is recessed.

Figure 5A:
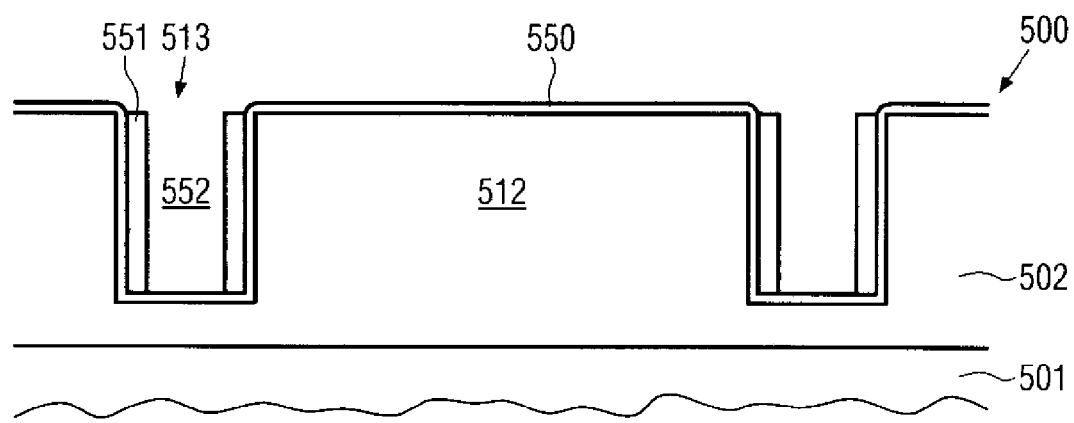
FIGS. 5a-5d schematically illustrate cross-sectional views of a trench isolation structure during various manufacturing stages, wherein a portion is recessed by selectively removing material of the isolation trench.

FIG. 5a schematically illustrates a cross-sectional view of a semiconductor device 500 comprising an isolation structure 513 in the form of a trench isolation formed in a silicon-containing semiconductor layer 502 that is formed above a substrate 501. The isolation structure 513 may define an active semiconductor area 512 within the semiconductor layer 502. In this manufacturing stage, the isolation structure 513 may comprise a trench 552, in which may be formed a spacer 551, for instance comprised of any appropriate material having a high etch selectivity with respect to the material of the active semiconductor area 512 and to further material to be filled in the trench 552. For example, the spacer 552 may be comprised of silicon nitride. In one illustrative embodiment, a liner 550, for instance comprised of silicon dioxide, may be provided on surfaces of the trench 552 and the active semiconductor area 512.

The device 500 as shown in FIG. 5a may be formed by the following processes. The trench 552 may be formed on the basis of well-established lithography and etch techniques, followed by the formation of the optional liner 550, which may be accomplished by oxidation and/or deposition. Thereafter, a spacer layer may be deposited and may be etched so as to obtain the spacer 551, wherein the optional liner 550 may provide a high degree of integrity of the surface of the active semiconductor area 512.

Figure 5B:
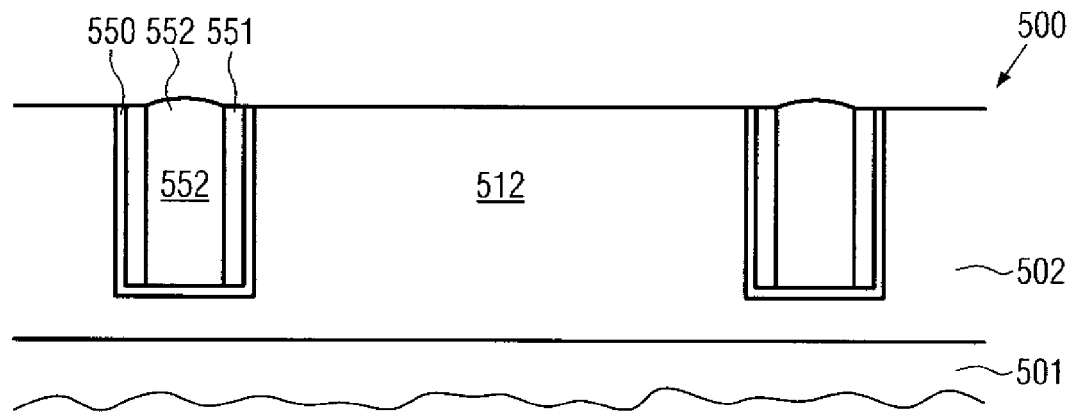

FIG. 5b schematically depicts the device 500, when a fill material 553, such as silicon dioxide, is filled into the trench, which may be accomplished by appropriate deposition techniques, such as chemical vapor deposition (CVD) using well-established process parameters. Thereafter, excess material may be removed by, for instance, chemical mechanical polishing (CMP).

Figure 5C:
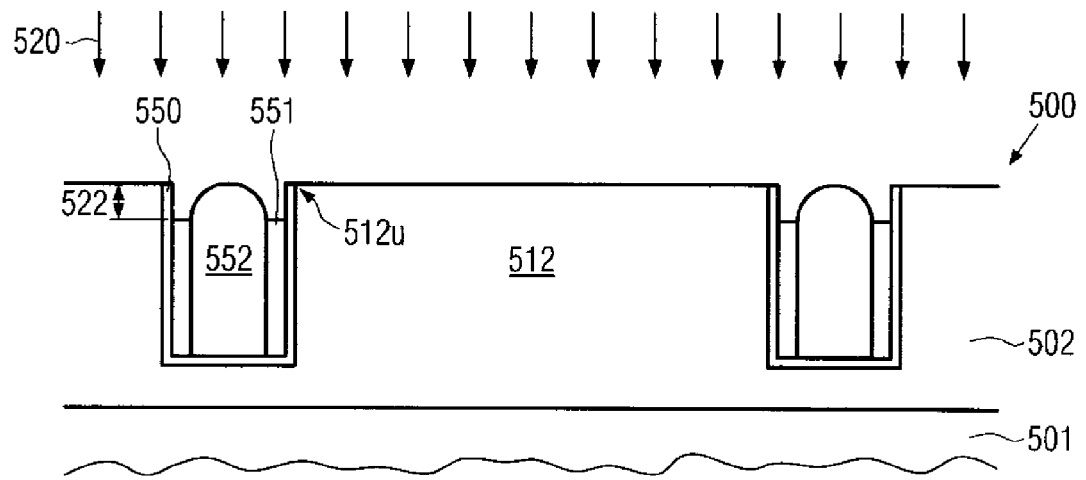

FIG. 5c schematically illustrates the device 500 when exposed to a selective etch process 520 for selectively recessing the spacer 551. For example, the process 520 may be performed as a wet chemical etch process, for instance, on the basis of hot phosphoric acid, when the spacer 551 is comprised of silicon nitride. Thus, a desired degree of recessing 522 may be achieved in the vicinity of the active semiconductor area 512, while a central portion of the isolation structure 513, i.e., the material 553, may substantially maintain its initial height and hence the initial insulating effect. In some embodiments, the process 520 may comprise a further step for substantially completely exposing an upper portion $512u$ of the active semiconductor area 512, when the liner 550 is provided, while, in other embodiments, the upper portion $512u$ may be exposed in a subsequent cleaning process as is also described above with reference to the process 220.

Figure 5D:
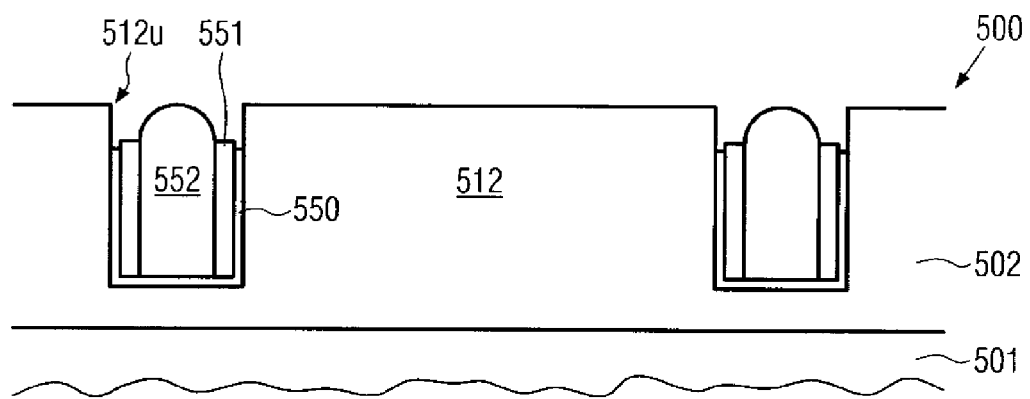

FIG. 5d schematically illustrates the device 500, when the upper portion $512u$ is completely exposed and the surface of the active semiconductor area 512 is prepared for receiving a gate insulation layer of uniform or different thickness, depending on device requirements.

Hence, by only recessing the lateral portions of the isolation structure 513, the total efficiency of the isolation structure may be substantially maintained while the advantages of an increased metal silicide and/or an increased effective channel width may be obtained.

As a result, the methods disclosed herein provide a technique for increasing the transistor drive current capability by reducing the series resistance compared to conventional devices of the same design in that the silicidation process may be enhanced by exposing an upper portion of the sidewall of an active semiconductor area defined by the isolation structure. Hence, an increased surface area is available during the chemical reaction between the metal and the silicon contained in the active semiconductor area. The exposure of the upper sidewall portion may be accomplished by recessing the isolation structure at any manufacturing stage prior to forming the metal silicide, wherein, in illustrative embodiments, one or more etch or cleaning processes that are performed for forming other components, such as a gate electrode, an offset spacer and the like, are suitably adapted to obtain the desired degree of recessing. In some cases, the recessing may be accomplished by a plurality of individual steps at different manufacturing stages, thereby maintaining the degree of process modification of standard processes at a low level. Moreover, in other illustrative embodiments, additionally or alternatively to modifying standard process steps, dedicated etch processes may be performed in order to recess the isolation structure at any appropriate stage. In some embodiments, the recessing is performed, at least partially, prior to forming the gate electrode of the transistor, thereby providing enhanced channel controllability at the interface between the isolation structure and the channel region, which may result in an increase of the effective channel width. Thus, for otherwise identical design dimension, such as isolation trench width, transistor width and the like, a significant gain in performance may be achieved.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A method, comprising:
    forming a first trench isolation structure to define a first active semiconductor area in a silicon-containing semiconductor layer formed above a substrate;
    forming a second trench isolation structure to define a second active semiconductor area in said silicon-containing semiconductor layer;
    forming a first sub-layer of a gate insulation layer on said first semiconductor area and on said second active semiconductor area;
    exposing a portion of a sidewall of said first active semiconductor area, a non-exposed portion of said sidewall forming an interface with said first trench isolation structure;
    removing a portion of said first sub-layer in said first active semiconductor area;
    forming a second sub-layer of said gate insulation layer on said first and second active semiconductor areas, wherein exposing said portion of said sidewall of said first active semiconductor area is performed after forming said first sub-layer and prior to forming said second sub-layer; and
    forming a metal silicide for a circuit element in said silicon-containing semiconductor layer.

2. The method of claim 1, wherein forming said gate insulation layer comprises cleaning an exposed surface of said first active semiconductor area to remove contaminants therefrom and wherein exposing said portion of said sidewall of said active semiconductor area and cleaning said exposed surface of said first active semiconductor area is performed in a common process.

3. The method of claim 1, further comprising forming a semiconductor line above said gate insulation layer, said semiconductor line extending into said trench isolation structure, wherein exposing said portion of said sidewall of said active semiconductor area results in a lower height level of a portion of said semiconductor line located above said first trench isolation structure relative to a portion of said semiconductor line located above said first active semiconductor area.

4. The method of claim 1, further comprising forming a semiconductor line on said first sub-portion of said gate insulation layer prior to exposing said portion of said sidewall of said active semiconductor area.

5. The method of claim 4, further comprising forming a spacer on a sidewall of said semiconductor line by depositing a spacer layer and anisotropically etching said spacer layer, wherein exposing said portion of said sidewall of said active semiconductor area and anisotropically etching said spacer layer are performed in a common process.

6. The method of claim 1, wherein exposing said portion of said sidewall of said active semiconductor area comprises recessing at least a portion of said first trench isolation structure.

7. The method of claim 6, wherein recessing at least a portion of said trench isolation structure comprises a plurality of etch processes.

8. A method, comprising:
    forming an isolation structure in a silicon-containing semiconductor layer to define an active semiconductor area, wherein forming said isolation structure comprises forming a trench, forming a spacer element comprised of a first insulating material on sidewalls of said trench and filling said trench with a second material other than said first insulating material;
    recessing at least a portion of said isolation structure so as to obtain a lower height level of said recessed portion relative to a height level defined by a surface of said active semiconductor area by etching said first insulating material selectively to said second material; and
    forming a metal silicide in a portion of said active semiconductor area.

9. The method of claim 8, further comprising forming a semiconductor line above said active semiconductor area and said recessed portion.

10. The method of claim 8, wherein recessing said at least a portion of said isolation structure comprises performing a plurality of etch steps.

11. The method of claim 8, wherein recessing said at least a portion of said isolation structure comprises performing a wet chemical etch process.

12. The method of claim 11, wherein said wet chemical etch process is performed to also remove contaminants from an exposed surface of said active semiconductor area.

13. The method of claim 8, wherein recessing said at least a portion of said isolation structure comprises performing a dry etch process.

* * * * *